United States Patent [19]

Mijuskovic

[11] Patent Number: 4,896,157
[45] Date of Patent: Jan. 23, 1990

[54] DIGITAL TO ANALOG CONVERTER HAVING SINGLE RESISTIVE STRING WITH SHIFTABLE VOLTAGE THEREACROSS

[75] Inventor: Dejan Mijuskovic, Tempe, Ariz.
[73] Assignee: Motorola, Inc.
[21] Appl. No.: 297,014
[22] Filed: Jan. 17, 1989
[51] Int. Cl.$^4$ .............................................. H03M 1/66
[52] U.S. Cl. ................................... 341/144; 341/154; 341/135; 323/354
[58] Field of Search ....................... 341/144, 146, 154; 323/354

[56] References Cited

U.S. PATENT DOCUMENTS

| | | | |
|---|---|---|---|
| 4,665,381 | 5/1987 | Masuda et al. | 341/145 |
| 4,683,458 | 7/1987 | Hallgren | 341/154 |
| 4,810,949 | 3/1989 | Schiemenz et al. | 323/354 |

*Primary Examiner*—William M. Shoop, Jr.
*Assistant Examiner*—Helen Kim
*Attorney, Agent, or Firm*—Michael D. Bingham

[57] ABSTRACT

A digital to analog converter comprises a plurality of resistors coupled in series, having first and second nodes at the repsective ends of the plurality of resistors coupled in series and a plurality of nodes, one each between each of the plurality of resistors. A multiplexing circuit is coupled to the first and second nodes and the plurality of nodes, for selecting the voltage on one of the first and second nodes and the plurality of nodes in response to a digital input signal and providing the result as an analog output signal. An input circuit is coupled to the first and second nodes for adjusting the voltage level at both the first and second nodes in response to the digital input signal, wherein the voltage difference between the first and second nodes remains substantially the same and the current through each of the resistors remains substantially the same.

8 Claims, 2 Drawing Sheets

DIGITAL TO ANALOG CONVERTER HAVING SINGLE RESISTIVE STRING WITH SHIFTABLE VOLTAGE THEREACROSS

FIELD OF THE INVENTION

This invention relates in general to digital to analog converters (DACs), and more specifically, to a DAC having a high current to least significant bit ratio, increased speed without increased power, and wherein the accuracy of the upper bits is independent of the current.

BACKGROUND OF THE INVENTION

Several types of digital to analog converters (DACs) that supply an analog output current or voltage that is a linear product of an analog input reference voltage and a digital input word are well known in the art, including the R-string DAC, the R-2R resistance ladder, the current steered DAC and the capacitive based DAC. The R-string DAC comprises a first plurality of resistors in series coupled between two reference voltages supplied by two operational amplifiers. A second plurality of resistors is selectively coupled in parallel to each resistor in the first plurality of resistors. The voltages between each of the resistors of the second plurality of resistors are multiplexed to provide the analog output. However, the parallel combination of unique plurality of resistors creates current errors in the first plurality of series connected resistors. Traditionally, to reduce this current error, the unique plurality of resistors comprise large resistances. This however decreases circuit speed dramatically.

The current steered DAC comprises a plurality of current sources which are switched by digital binary-weighted input signals for providing an analog current to the output. Resistors are typically used to determine the voltage that each current source contributes to the output voltage. However, it is difficult to match the transistors used as the current sources for low current applications.

The R-2R resistance ladder comprises a first plurality of resistors connected in series and a second plurality of resistors, one each coupled between each bit of the binary input signal and a node between one each of the resistors of the first plurality of resistors. Each of the second plurality of resistors have twice the resistance of each of the first plurality of resistors. The analog signal is produced at one end of the first plurality of resistors. However, the total resistance of the ladder is small and highly capacitive, providing a slow, high power circuit.

Thus, what is needed is a DAC having a high current to least significant bit ratio, increased speed without increased power, and wherein the accuracy of the upper bits is independent of the current.

SUMMARY OF THE INVENTION

Accordingly, it is an object of the present invention to provide an improved digital to analog converter.

Another object of the present invention is to provide a digital to analog converter having a high current to least significant bit ratio.

Yet another object of the present invention is to provide a digital to analog converter wherein the accuracy of the upper bits is independent of the current.

Still another object of the present invention is to provide a digital to analog converter having increased speed without increased power.

In carrying out the above and other objects of the invention in one form, there is provided a digital to analog converter comprising a plurality of resistors coupled in series, having first and second nodes at the respective ends of said plurality of resistors coupled in series and a plurality of nodes, one each between each of said plurality of resistors. A multiplexing circuit is coupled to said first and second nodes and said plurality of nodes, for selecting a voltage on one of said first and second nodes and said plurality of nodes in response to a digital input signal and providing the result as an analog output signal. An input circuit is coupled to said first and second nodes for adjusting the voltage level at both said first and second nodes in response to said digital input signal, wherein the voltage difference between said first and second nodes remains substantially the same and the current through each of the resistors remains substantially the same.

The above and other objects, features, and advantages of the present invention will be better understood from the following detailed description taken in conjunction with the accompanying drawings.

DETAILED DESCRIPTION OF THE INVENTION

Figure 1:
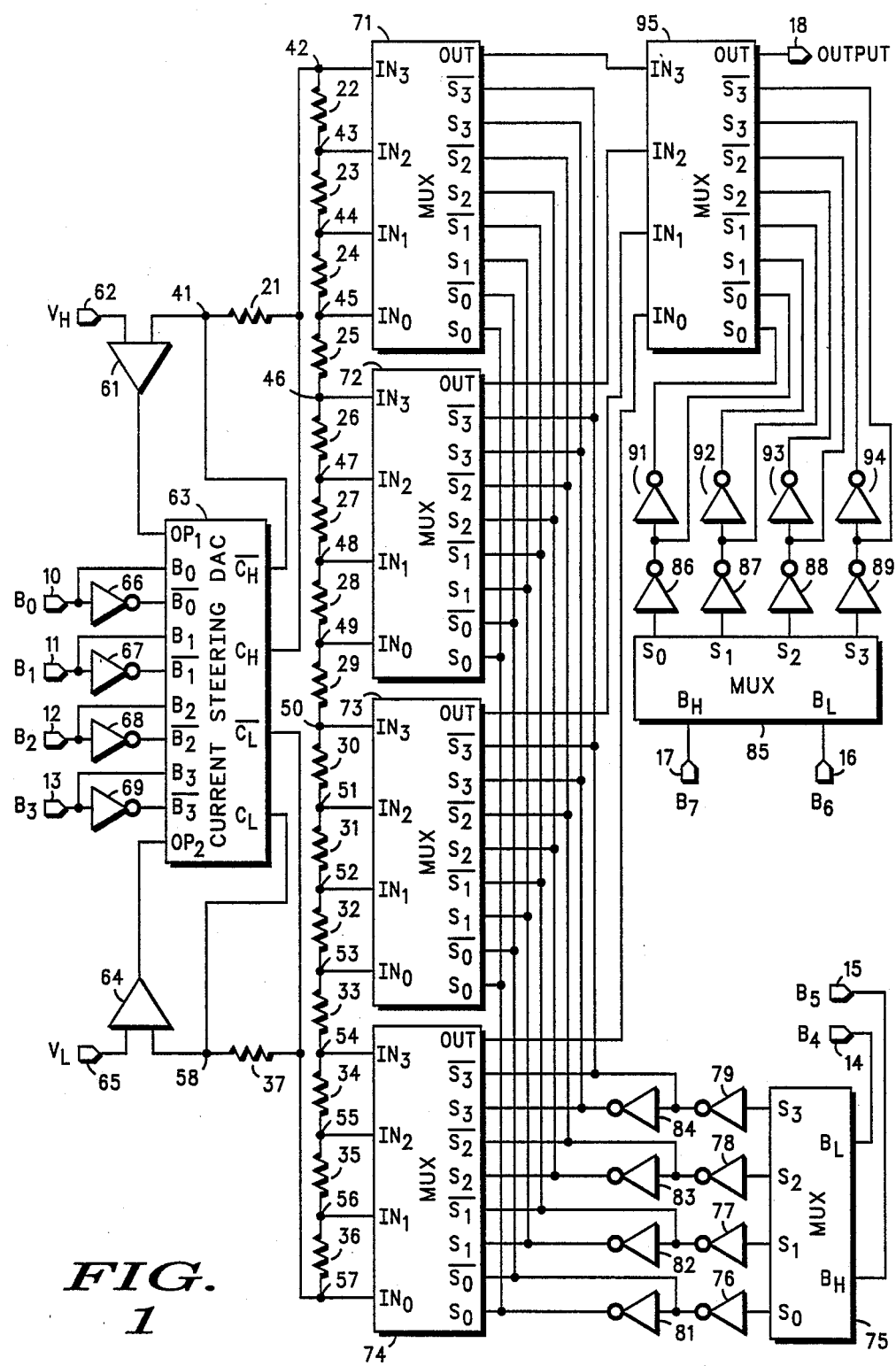
FIG. 1 is a partial block diagram of the preferred embodiment.

Referring to FIG. 1, the preferred embodiment comprises an eight bit digital to analog (DAC) converter receiving a digital input signal including bits $B_0$ through $B_7$ at input terminals 10 through 17, respectively, and providing an analog output signal OUTPUT at terminal 18. An eight bit DAC is shown only by way of example. The present invention may be implemented for a DAC comprising any number of bits. Resistors 21 through 37 are coupled in series, respectively, forming a resistor "string" having nodes 41 through 58. Operational amplifier 61 has a first input coupled to terminal 62 for receiving a high voltage $V_H$ reference, a second input coupled to node 41, and an output coupled to input $OP_1$ of steering DAC 63. Operational amplifier 64 has a first input coupled to terminal 65 for receiving a low voltage $V_L$ reference, a second input coupled to node 58, and an output coupled to input $OP_2$ of steering DAC 63. Amplifiers 61 and 64 provide voltages $OP_1$ and $OP_2$, respectively, such that reference voltages $V_H$ and $V_L$ appear at nodes 41 and 58, respectively.

Inverters 66 through 69 are coupled between terminals 10 through 13, respectively, and inputs $\overline{B_0}$ through $\overline{B_3}$, respectively, of current steering DAC 63. Input terminals 10 through 13 are further connected to inputs $B_0$ through $B_3$, respectively. Current steering outputs $\overline{C_H}$, $C_H$, $\overline{C_L}$, and $C_L$ of current steering DAC 63 are coupled to nodes 41, 42, 57, and 58, respectively. The levels of output currents from $\overline{C_H}$ and $C_H$ to nodes 41 and 42, respectively, and currents from nodes 57 and 58 into $\overline{C_L}$ and $C_L$ of steering DAC 63, respectively, are determined by bits $B_0$ through $B_3$. The sum of currents into $\overline{C_L}$ and $C_L$ (and from $\overline{C_H}$ and $C_H$) are constant and substantially similar to the current through resistors 22 through 36. As bits $B_0$ through $B_3$ change states, the voltages at nodes 42 and 57 change.

Analog multiplexers 71 through 74 each have inputs $IN_0$ through $IN_3$ coupled to nodes 45 through 42, 49 through 46, 53 through 50, and 57 through 54, respectively. Digital multiplexer 75 has inputs $B_L$ and $B_H$ connected to terminals 14 and 15, respectively, and outputs $S_0$ through $S_3$ connected to the inputs of inverters 76 through 79, respectively. The outputs of inverters 76 through 79 are connected to the inputs of inverters 81 through 84, respectively, and to the inputs $\overline{S_0}$ through $\overline{S_3}$, respectively, of multiplexers 71 through 74. The outputs of inverters 81 through 84 are connected to the inputs $S_0$ through $S_3$, respectively, of multiplexers 71 through 74.

Digital multiplexer 85 has its inputs $B_L$ and $B_H$ connected to terminals 16 and 17, respectively, and its outputs $S_0$ through $S_3$ connected to the inputs of inverters 86 through 89. The outputs of inverters 86 through 89 are connected to the inputs of inverters 91 through 94, respectively, and to the inputs $\overline{S_0}$ through $\overline{S_3}$, respectively, of analog multiplexer 95. The outputs of inverters 91 through 94 are connected to the inputs $S_0$ through $S_3$, respectively, of multiplexer 95. Multiplexer 95 has inputs $IN_0$ through $IN_3$ connected to the outputs of multiplexers 74 through 71, respectively, and its output connected to output terminal 18. In response to the bits $B_4$ through $B_7$, a voltage at one of nodes 42 through 57 are selected by multiplexers 71 through 74 and 95 and provided as an analog output signal at terminal 18.

Figure 2:
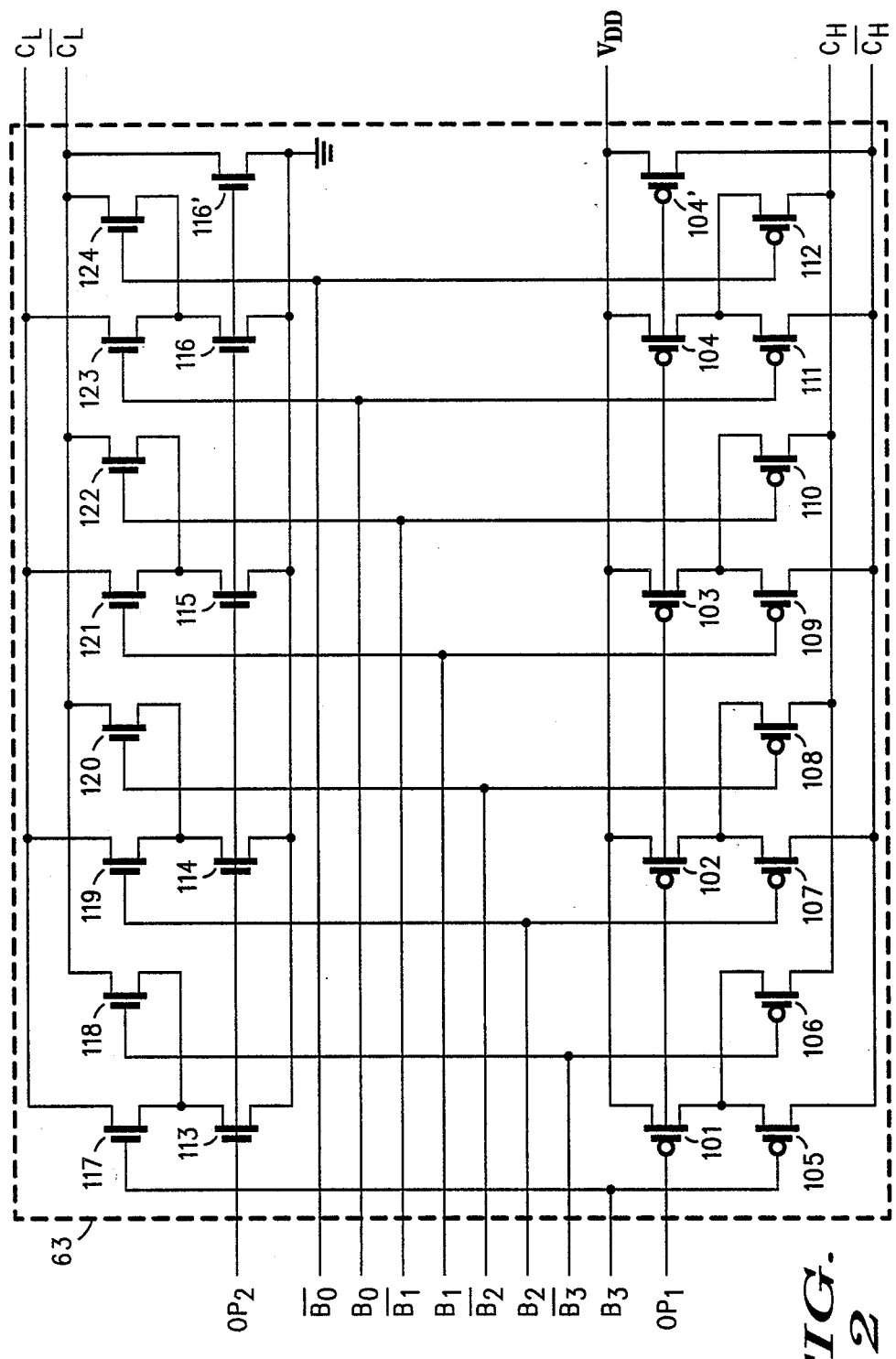
FIG. 2 is a schematic of the steering DAC of FIG. 1.

Referring to FIG. 2, current steering DAC 63 comprises transistors 101 through 104' having their gates coupled to receive signal $OP_1$ and their sources connected to supply voltage terminal $V_{DD}$. Transistors 105, 107, 109, and 111 have their gates coupled to receive signals $B_3$ through $B_0$, respectively, their sources connected to the drains of transistor 101 through 104, respectively, and their drains connected to provide signal $C_H$. Transistors 106, 108, 110, and 112 have their gates coupled to receive signals $\overline{B_3}$ through $\overline{B_0}$, respectively, their sources connected to the drains of transistor 101 through 104, respectively, and their drains connected to provide signal $\overline{C_H}$.

Similarly, transistors 113 through 116' have their gates coupled to receive signal $OP_2$ and their sources connected to supply voltage terminal . Transistors 117, 119, 121, and 123 have their gates coupled to receive signals $B_3$ through $B_0$, respectively, their sources connected to the drains of transistor 113 through 116, respectively, and their drains connected to provide signal $C_L$. Transistors 118, 120, 122, and 124 have their gates coupled to receive signals $\overline{B_3}$ through $\overline{B_0}$, respectively, their sources connected to the drains of transistor 113 through 116, respectively, and their drains connected to provide signal $\overline{C_L}$. The state of bits $B_3$ and $\overline{B_3}$ will select transistors 117 or 118 for providing the voltages $C_L$ and $C_L$ as appropriate. A current is sourced to transistors 117 and 118 by transistor 113 depending on voltage $OP_2$ provided by amplifier 64. Therefore, the currents to $C_L$, $\overline{C_L}$, $C_H$ and $\overline{C_H}$ are determined by the states of bits $B_0$ through $B_3$.

Transistors 101 through 104 and 113 through 116 function as current sources for the respective differential transistor pair. These transistors 101 through 104 and 113 through 116 are weighted such that the current through transistors 116, 115, 114, and 113 (likewise transistors 104, 103, 102, and 101) are doubled in value over the next respective transistor by selecting the appropriate size during manufacture. In other words, transistor 115 carries twice the current of transistor 116, and transistor 113 carries eight times the current of transistor 116. Transistors 116' and 104' carry the same current as transistors 116 and 104, respectively. Therefore, both transistors 116 and 104 carry one sixteenth of the total current through transistors 113 through 116' and transistors 101 through 104', respectively.

The upper four bits of the input signal $B_0$ through $B_7$ are resolved on resistors 21 through 37 by analog multiplexing of sixteen possible outputs from nodes 42 through 57. Current steering DAC 63 adjusts the voltage level on the string of resistors 22 through 36 in accordance with the lower four bits of the input signal $B_0$ through $B_7$. If transistors 118, 120, 122, and 124 are on, the current to $\overline{C_L}$ will be maximized and no current will flow through resistor 37 and the voltage $V_L$ will appear at node 57. Since resistors 21 through 37 all have the same resistance value, the current in the resistor string develops a sixteen VLSB (least significant bit voltage) across each of resistors 21 through 37. By switching one of the differential transistor pair, i.e., turning transistor 124 off and transistor 123 on, the voltage at node 57 increases by one VLSB. By switching another of the differential transistor pair, i.e., turning transistor 118 off and transistor 117 on, the voltage at node 57 increases by eight VLSB. The operation of transistors 105 through 112 is similar, except that the current change through resistor 21 is the inverse of the current change through resistor 37. Therefore, the voltage at node 42 will change as the voltage at node 57 changes. Since the voltage difference across resistors 22 through 36 does not change during this voltage "movement", the current through resistors 22 through 36 does not change. Since the voltage change at nodes 42 and 57 is accomplished by switching transistors 105 through 112 and 117 through 124 instead of driving operational amplifiers as with the prior art resistor string DACs, operational amplifiers 61 and 64 will always have the same DC operating conditions. This provides for an increased circuit speed.

The output impedance of transistors 105 through 112 and 117 through 124 does not cause significant errors because the maximum voltage difference among transistors 105 through 112 and 117 through 124 is one sixteenth of the voltage range. The maximum error due to transistor impedance is three percent of LSB under typical conditions.

By now it should be appreciated that there has been provided a DAC having a high current to least significant bit ratio, increased speed without increased power, and wherein the accuracy of the upper bits is independent of the current.

I claim:

1. A resistive string digital to analog converter comprising:
   a plurality of resistors coupled in series, having first and second nodes at the respective ends of said plurality of resistors coupled in series and a plurality of nodes, one each between each of said plurality of resistors;
   first means coupled to said first and second nodes and said plurality of nodes, for selecting a voltage on one of said plurality of nodes in response to a first portion of a digital input signal and providing the result as an analog output signal; and
   second means coupled to said first and second nodes for adjusting the voltage level at both said first and second nodes in response to a second portion of said digital input signal, wherein the voltage difference between said first and second nodes remains substantially the same and the current through said plurality resistors remains substantially the same; wherein said second means includes,
  a. a first resistor;
  b. a second resistor;
  c. a current steering digital to analog converter coupled to receive said second portion of said digital input signal and having a first output coupld to said first node, a second output coupled to said first output by said first resistor, a third output coupled to said second node, and a fourth output coupled to said third output of said current steering digital to analog converter by said second resistor;
  d. a first amplifier having a first input coupled to received a first reference voltage, a second input coupled to said second output of said current steering digital to analog converter, and an output coupled to a first input of said current steering digital to analog converter; and
  e. a second amplifier having a firstinput coupled to receive a second reference voltage, a second input coupled to said fourth output of said current steering digital to analog converter, and an output coupled to a second input of said current steering digital to analog converter.

2. A resistive string digital to analog converter comprising:
  a first resistor coupled between first and second nodes;
  a second resistor coupled between third and fourth nodes;
  a plurality of resistors coupled in series, said series coupled plurality of resistors coupled between said second and third nodes, and having a plurality of nodes, one each between each of said plurality of resistors;
  first means coupled to said second and third nodes and said plurality of nodes for selecting one of said second and third nodes and said plurality of nodes for providing a voltage thereon as an analog output signal in response to a first portion of a digital input signal;
  second means coupled to said first, second, third, and fourth nodes for providing first, second, third, and fourth voltages at said first, second, third, and fourth nodes, respectively, said first, second, third, and fourth voltages changing in response to a second portion of said input signal, wherein the voltage difference between said second and third voltage remain substantially the same.

3. The resistive string digital to analog converter according to claim 2 wherein said second means comprises:
  third means coupled to said first, second, third, and fourth nodes for supplying said first, second, third, and fourth voltages thereto, respectively, in response to said second portion of said digital input signal, wherein the magnitude of said first and second voltages are also determined by a fifth voltage and the magnitude of said third and fourth voltages are also determined by a sixth voltage;
  fourth means coupled between said first node and said third means for providing said fifth voltage; and
  fifth means coupled between said fourth node and said third means for providing said sixth voltage.

4. The resistive string digital to analog converter according to claim 3 wherein said third means comprises a current switching digital to analog converter having a plurality of inputs for receiving said second portion of said digital input signal, a first input coupled to said fourth means, a second input coupled to said fifth means, and first, second, third, and fourth outputs coupled to said first, second, third, and fourth nodes, respectively.

5. The resistive string digital to analog converter according to claim 4 wherein said fourth means comprises an operational amplifier having a first input coupled to receive a first reference voltage, a second input coupled to said first node, and an output coupled to said first input of said current switching digital to analog converter.

6. The resistive string digital to analog converter according to claim 5 wherein said fifth means comprises an operational amplifier having a first input coupled to receive a second reference voltage, a second input coupled to said fourth node, and an output coupled to said second input of said current switching digital to analog converter.

7. The resistive string digital to analog converter according to claim 6 wherein said current switching digital to analog converter comprises:
  a first plurality of transistors having their gates coupled to said first input of said current switching digital to analog converter and a source coupled to a first supply voltage;
  a second plurality of transistors having their gates coupled to said second input of said current switching digital to analog converter and a source coupled to a second supply voltage;
  a first plurality of differentially connected transistor pairs, each pair having their sources coupled to a drain of one of said first plurality of transistors and their drains coupled to said first and second outputs of said current switching digital to analog converter, respectively; and
  a second plurality of differentially connected transistor pairs, each pair having their sources coupled to a drain of one of said second plurality of transistors and their drains coupled to said third and fourth outputs of said current switching digital to analog converter, respectively.

8. A digital to analog converter comprising:
  a plurality of resistors coupled in series, having first and second nodes at the ends of said plurality of resistors and a plurality of nodes, one each between each of the plurality of resistors;
  first means for providing an adjustable current in response to digital input signals;
  second means for providing an adjustable current in response to said digital input signals;
  a first amplifier having a first input coupled to a first reference voltage and an output coupled to said first node by said first means;
  a first resistive element coupled between a second input of said first amplifier and said first node;
  a second amplifier having a first input coupled to a second reference voltage and an output coupled to said second node by said second means;
  a second resistive element coupled between a second input of said second amplifier and said second node; and
  third means coupled to said first and second nodes and said plurality of nodes, for selecting a voltage on one of said first and second nodes and said plurality of nodes as an analog output signal in response to said digital input signals.

* * * * *